United States Patent
Lin et al.

(10) Patent No.: US 9,711,438 B2
(45) Date of Patent: Jul. 18, 2017

(54) SEMICONDUCTOR DEVICE AND METHOD OF FORMING A DUAL UBM STRUCTURE FOR LEAD FREE BUMP CONNECTIONS

(71) Applicant: STATS ChipPAC, Ltd., Singapore (SG)

(72) Inventors: Li-Jen Lin, HsinChu (TW); Stephen A. Murphy, San Jose, CA (US); Wei Sun, Shanghai (CN)

(73) Assignee: STATS ChipPAC, Pte. Ltd., Singapore (SG)

( * ) Notice: Subject to any disclaimer, the term of this patent is extended or adjusted under 35 U.S.C. 154(b) by 0 days.

(21) Appl. No.: 14/275,213

(22) Filed: May 12, 2014

(65) Prior Publication Data

US 2014/0264850 A1    Sep. 18, 2014

Related U.S. Application Data

(63) Continuation of application No. 13/030,022, filed on Feb. 17, 2011, now Pat. No. 8,759,209.

(Continued)

(51) Int. Cl.
*H01L 23/498* (2006.01)
*H01L 23/00* (2006.01)
*H01L 21/768* (2006.01)

(52) U.S. Cl.
CPC .. *H01L 23/49811* (2013.01); *H01L 21/76877* (2013.01); *H01L 24/03* (2013.01); *H01L 24/05* (2013.01); *H01L 24/11* (2013.01); *H01L 24/13* (2013.01); *H01L 2224/02126* (2013.01); *H01L 2224/0345* (2013.01); *H01L 2224/0361* (2013.01); *H01L 2224/03452* (2013.01);

(Continued)

(58) Field of Classification Search
CPC ..... H01L 23/49811; H01L 24/05; H01L 24/03
USPC .......... 257/213, 288, 734, 779, 780
See application file for complete search history.

(56) References Cited

U.S. PATENT DOCUMENTS 5,372,511 A * 12/1994 Keung ............ 434/345
5,807,453 A *  9/1998 Smith ......... H01L 23/4985
                                              156/150

(Continued)

FOREIGN PATENT DOCUMENTS

CN    101106114 A    1/2008
CN    101304014 A    11/2008

(Continued)

*Primary Examiner* — Michele Fan
(74) *Attorney, Agent, or Firm* — Robert D. Atkins; Patent Law Group: Atkins and Associates, P.C.

(57) ABSTRACT

A semiconductor device has a substrate with a contact pad. A first insulation layer is formed over the substrate and contact pad. A first under bump metallization (UBM) is formed over the first insulating layer and is electrically connected to the contact pad. A second insulation layer is formed over the first UBM. A second UBM is formed over the second insulation layer after the second insulation layer is cured. The second UBM is electrically connected to the first UBM. The second insulation layer is between and separates portions of the first and second UBMs. A photoresist layer with an opening over the contact pad is formed over the second UBM. A conductive bump material is deposited within the opening in the photoresist layer. The photoresist layer is removed and the conductive bump material is reflowed to form a spherical bump.

5 Claims, 9 Drawing Sheets

Related U.S. Application Data

(60) Provisional application No. 61/317,664, filed on Mar. 25, 2010.

(52) U.S. Cl.
CPC .............. *H01L 2224/03462* (2013.01); *H01L 2224/03464* (2013.01); *H01L 2224/03912* (2013.01); *H01L 2224/0401* (2013.01); *H01L 2224/05018* (2013.01); *H01L 2224/05022* (2013.01); *H01L 2224/05023* (2013.01); *H01L 2224/05026* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05558* (2013.01); *H01L 2224/05572* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/10126* (2013.01); *H01L 2224/1145* (2013.01); *H01L 2224/1147* (2013.01); *H01L 2224/11462* (2013.01); *H01L 2224/11464* (2013.01); *H01L 2224/11849* (2013.01); *H01L 2224/13006* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13155* (2013.01); *H01L 2224/94* (2013.01); *H01L 2924/0002* (2013.01); *H01L 2924/00013* (2013.01); *H01L 2924/00014* (2013.01); *H01L 2924/014* (2013.01); *H01L 2924/01006* (2013.01); *H01L 2924/01013* (2013.01); *H01L 2924/01019* (2013.01); *H01L 2924/01024* (2013.01); *H01L 2924/01029* (2013.01); *H01L 2924/01032* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01075* (2013.01); *H01L 2924/01079* (2013.01); *H01L 2924/01082* (2013.01); *H01L 2924/01322* (2013.01); *H01L 2924/01327* (2013.01); *H01L 2924/10329* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/181* (2013.01)

(56) References Cited

U.S. PATENT DOCUMENTS

| | | | |
|---|---|---|---|
| 5,841,166 A * | 11/1998 | D'Anna et al. | 257/335 |
| 5,962,918 A * | 10/1999 | Kimura | 257/738 |
| 6,020,640 A | 2/2000 | Efland et al. | |
| 6,136,688 A | 10/2000 | Lin et al. | |
| 6,166,444 A | 12/2000 | Hsuan et al. | |
| 6,204,074 B1 * | 3/2001 | Bertolet et al. | 438/18 |
| 6,350,668 B1 | 2/2002 | Chakravorty | |
| 6,417,089 B1 * | 7/2002 | Kim et al. | 438/612 |
| 6,455,408 B1 | 9/2002 | Hwang et al. | |
| 6,462,426 B1 | 10/2002 | Kelkar et al. | |
| 6,534,396 B1 | 3/2003 | Fahn et al. | |
| 6,590,295 B1 | 7/2003 | Liao et al. | |
| 6,596,619 B1 | 7/2003 | Wang et al. | |
| 6,608,377 B2 | 8/2003 | Chang et al. | |
| 6,656,826 B2 | 12/2003 | Ishimaru | |
| 6,731,007 B1 * | 5/2004 | Saito | H01L 21/76838 257/762 |
| 6,768,199 B2 * | 7/2004 | Yoon et al. | 257/758 |
| 6,878,633 B2 | 4/2005 | Raskin et al. | |
| 7,053,490 B1 | 5/2006 | Wang | |
| 7,271,498 B2 | 9/2007 | Huang | |
| 7,364,998 B2 | 4/2008 | Chiu et al. | |
| 7,592,244 B2 | 9/2009 | Kurosawa | |
| 7,719,116 B2 | 5/2010 | Wakabayashi et al. | |
| 7,838,991 B1 | 11/2010 | Mostafazadeh et al. | |
| 7,863,741 B2 | 1/2011 | Ozaki et al. | |
| 7,977,783 B1 * | 7/2011 | Park | H01L 24/11 257/692 |
| 8,258,055 B2 | 9/2012 | Hwang et al. | |
| 8,426,303 B2 | 4/2013 | Suzuki et al. | |
| 8,624,391 B2 | 1/2014 | Chen | |
| 2002/0111009 A1 | 8/2002 | Huang et al. | |
| 2002/0127836 A1 * | 9/2002 | Lin et al. | 438/612 |
| 2002/0163069 A1 | 11/2002 | Lu et al. | |
| 2003/0073036 A1 | 4/2003 | Peng et al. | |
| 2003/0119300 A1 | 6/2003 | Chiu et al. | |
| 2003/0199159 A1 | 10/2003 | Fan et al. | |
| 2003/0201521 A1 * | 10/2003 | Tsai et al. | 257/678 |
| 2004/0040855 A1 | 3/2004 | Batinovich | |
| 2004/0182915 A1 | 9/2004 | Bachman et al. | |
| 2004/0185649 A1 | 9/2004 | Huang et al. | |
| 2004/0245638 A1 * | 12/2004 | Nemtsev et al. | 257/758 |
| 2004/0266066 A1 | 12/2004 | Wang | |
| 2005/0006759 A1 | 1/2005 | Huang | |
| 2005/0020047 A1 | 1/2005 | Mis et al. | |
| 2005/0146033 A1 | 7/2005 | Strandberg et al. | |
| 2005/0191836 A1 | 9/2005 | Tzeng et al. | |
| 2005/0205978 A1 * | 9/2005 | Pu et al. | 257/678 |
| 2005/0243601 A1 * | 11/2005 | Harari | 365/185.3 |
| 2006/0057832 A1 | 3/2006 | Kripesh et al. | |
| 2006/0076679 A1 | 4/2006 | Batchelor et al. | |
| 2006/0103020 A1 | 5/2006 | Tong et al. | |
| 2006/0286734 A1 * | 12/2006 | Mussig et al. | 438/197 |
| 2007/0020906 A1 * | 1/2007 | Chiu et al. | 438/597 |
| 2007/0042594 A1 | 2/2007 | Wakabayashi et al. | |
| 2007/0069346 A1 | 3/2007 | Lin et al. | |
| 2007/0069347 A1 | 3/2007 | Lin et al. | |
| 2007/0087544 A1 * | 4/2007 | Chang et al. | 438/612 |
| 2007/0117368 A1 | 5/2007 | Tsai et al. | |
| 2007/0161223 A1 | 7/2007 | Hu et al. | |
| 2007/0200239 A1 * | 8/2007 | Su | 257/738 |
| 2007/0290343 A1 * | 12/2007 | Harada et al. | 257/737 |
| 2008/0023833 A1 | 1/2008 | Daubenspeck et al. | |
| 2008/0050905 A1 | 2/2008 | Uchida et al. | |
| 2008/0054461 A1 | 3/2008 | Lang et al. | |
| 2008/0061326 A1 * | 3/2008 | Yoshida et al. | 257/288 |
| 2008/0128905 A1 | 6/2008 | Lee et al. | |
| 2008/0131983 A1 * | 6/2008 | Lin et al. | 438/18 |
| 2008/0157362 A1 | 7/2008 | Chang et al. | |
| 2008/0200285 A1 * | 8/2008 | Haseth | 473/422 |
| 2008/0211093 A1 | 9/2008 | Ke et al. | |
| 2008/0284014 A1 | 11/2008 | Lee et al. | |
| 2009/0032975 A1 | 2/2009 | Do et al. | |
| 2009/0039491 A1 | 2/2009 | Kim et al. | |
| 2009/0140441 A1 | 6/2009 | Camacho et al. | |
| 2009/0206490 A1 | 8/2009 | Koide et al. | |
| 2009/0267213 A1 | 10/2009 | Lin et al. | |
| 2010/0013008 A1 * | 1/2010 | Oikawa | 257/329 |
| 2010/0013082 A1 | 1/2010 | Lin | |
| 2010/0052147 A1 * | 3/2010 | Grillberger et al. | 257/692 |
| 2010/0065322 A1 * | 3/2010 | Ogawa | H01L 21/563 174/262 |
| 2010/0155958 A1 * | 6/2010 | Kim | H01L 24/03 257/773 |
| 2010/0164104 A1 | 7/2010 | Daubenspeck et al. | |
| 2010/0167471 A1 | 7/2010 | Jin et al. | |
| 2010/0193950 A1 | 8/2010 | Lee et al. | |
| 2010/0210103 A1 | 8/2010 | Sameshima et al. | |
| 2010/0246152 A1 * | 9/2010 | Lin et al. | 361/783 |

(56) References Cited

U.S. PATENT DOCUMENTS

2011/0095413 A1    4/2011   Barth et al.
2011/0117718 A1    5/2011   Nakamura et al.

FOREIGN PATENT DOCUMENTS

CN    102034779 A    4/2011
TW    200524054 A    7/2005

* cited by examiner

SEMICONDUCTOR DEVICE AND METHOD OF FORMING A DUAL UBM STRUCTURE FOR LEAD FREE BUMP CONNECTIONS

CLAIM TO DOMESTIC PRIORITY

The present application is a continuation of U.S. patent application Ser. No. 13/030,022, now U.S. Pat. No. 8,759,209, filed Feb. 17, 2011, which claims the benefit of U.S. Provisional Application No. 61/317,664, filed Mar. 25, 2010, which applications are incorporated herein by reference.

FIELD OF THE INVENTION

The present invention relates in general to semiconductor devices and, more particularly, to a semiconductor device and method of forming a dual under bump metallization (UBM) structure for lead free bump connections.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

One common technique of interconnecting a semiconductor die with a printed circuit board or other device involves the use of solder bumps. FIG. 1 shows a conventional polyimide over UBM (POU) solder bump structure 10. An electrically conductive layer 14 is formed over an active surface of semiconductor wafer 12, and operates as a contact pad. Wafer 12 is inspected for initial quality control (IQC). An insulation or passivation layer 16 is formed over semiconductor wafer 12 and conductive layer 14. A portion of insulating layer 16 is removed by an etching process to expose a portion of conductive layer 14. Partially formed POU structure 10 undergoes a first scrubber clean. An electrically conductive layer or sputtered UBM 18 is formed over insulation layer 16 and conductive layer 14. A nickel (Ni) UBM or electrically conductive layer 20 is formed over and conformally applied to conductive layer 18 to operate as a bump pad for a later formed bump. Partially formed POU structure 10 undergoes a second scrubber clean. A layer of polyimide serves as an insulation or passivation layer 22, which is formed over conductive layer 18 and Ni UBM 20. The polyimide is coated, aligned, developed, cured, descumed, acid cleaned, and baked before dry film resist (DFR) laminating. An opening in insulation layer 22 is formed over Ni UBM 20. The DFR is laminated over insulation layer 22 and then undergoes an edge rinse, alignment, polyethylene terepthalate (PET) removal, development, first de-scum, hard bake, and second de-scum. Solder material is plated over of Ni UBM 20 and within an opening in the DFR layer. The DFR is stripped, plasma ash is applied, Ni UBM 20 is etched, and partially completed POU structure 10 undergoes a third scrubber clean. A flux coating is applied to the plated solder material, and the solder material is reflowed to form spherical ball or bump 24, which is formed over and electrically connects to Ni UBM 20. The device undergoes a flux clean, bump measurement, and final visual inspection (FVI) resulting in POU structure 10. Conventional POU structures like POU structure 10 include a risk of tin (Sn) from bump 24 traveling along a side wall of Ni UBM 20 to react with UBM copper (Cu) to form an inter metallic compound (IMC).

FIG. 2 shows a conventional polyimide and lead free bump structure 28. An electrically conductive layer 32 is formed over an active surface of semiconductor wafer 30 and operates as a contact pad. Wafer 30 is inspected for IQC. An insulation or passivation layer 34 is formed over semiconductor wafer 30 and contacts a sidewall of conductive layer 32. Partially formed bump structure 28 undergoes a scrubber clean and is baked. A layer of polyimide serves as an insulation or passivation layer 36, and is formed over conductive layer 32 and insulation layer 34. The polyimide is coated, aligned, developed, cured, de-scumed, and acid cleaned such that a portion of conductive layer 32 is exposed. An electrically conductive layer 38 is formed over and conformally applied to a portion of conductive layer 32 and a portion of insulation layer 36. In one embodiment, conductive layer 38 is sputtered to operate as a UBM for a later formed bump and includes one or more layers of titanium (Ti), Cu, and Ni. The device then undergoes a scrubber clean, and a DFR layer is laminated over insulation layer 36 and conductive layer 38. The DFR layer undergoes an edge beam rinse, alignment, PET removal, development, first de-scum, hard bake, and second de-scum. Solder material is plated over conductive layer 38 and within an opening in the DFR layer. The DFR is stripped, conductive layer 38 is etched, and the device undergoes a third scrubber clean, a first nitrogen gas (N2) treatment, a second etching, a fourth scrubber clean, a hard bake, and an oxygen gas (O2) plasma treatment. A flux coating is applied to the plated solder material, and the solder material is reflowed to form spherical ball or bump 40, which is formed over and electrically connects to conductive layer 38. The device then undergoes a flux clean, a second N2 treatment, bump measurement, a fifth scrubber clean, and FVI resulting in the polyimide and lead free bump structure 28.

Concerns regarding the reliability of solder joints are more acute for flipchip bonding with lead free solder, such as those presented in FIGS. 1 and 2. Lead free solders include Sn-based alloys with Cu and silver (Ag) which have higher melting points than traditional eutectic SnPb solders. The higher temperatures and higher Sn concentrations lead to more severe reactions between the SnPb solders and the UBMs which can lead to excessive IMC formation that may cause dewetting on the UBM and result in weak solder joints.

SUMMARY OF THE INVENTION

A need exists to improve solder joint reliability for lead free bump connections. Accordingly, in one embodiment, the present invention is a method of making a semiconductor device comprising the steps of providing a substrate including a conductive layer, forming a first under bump metallization (UBM) including a first portion over the conductive layer, forming a first insulating layer over the first UBM, forming a second UBM over the first insulating layer and the first portion of the first UBM, and forming a bump over the second UBM and the first portion of the first UBM.

In another embodiment, the present invention is a method of making a semiconductor device comprising the steps of providing a substrate, forming a first conductive layer over the substrate, forming a first insulating layer over the first conductive layer, forming a second conductive layer over the first insulating layer and the first conductive layer, and forming a bump over the first conductive layer and the second conductive layer.

In another embodiment, the present invention is a semiconductor device comprising a substrate including a conductive layer. A first UBM is formed over the conductive layer. A first insulating layer is formed over the first UBM. A second UBM is formed over the first insulating layer and the first UBM.

In another embodiment, the present invention is a semiconductor device comprising a substrate and a first conductive layer formed over the substrate. A first insulating layer is formed over the first conductive layer. A second conductive layer is formed over the first insulating layer and first conductive layer.

DETAILED DESCRIPTION OF THE DRAWINGS

Figure 1:
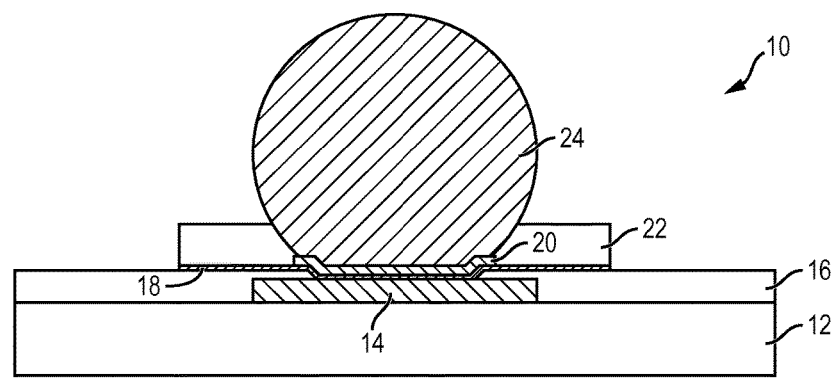
FIG. 1 illustrates a conventional POU structure.
Figure 2:
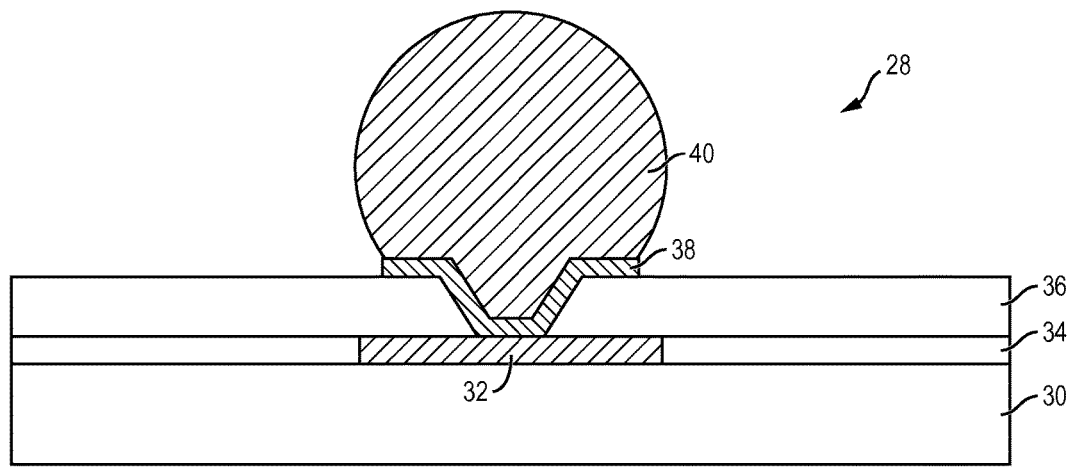
FIG. 2 illustrates a conventional polyimide with lead free solder structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
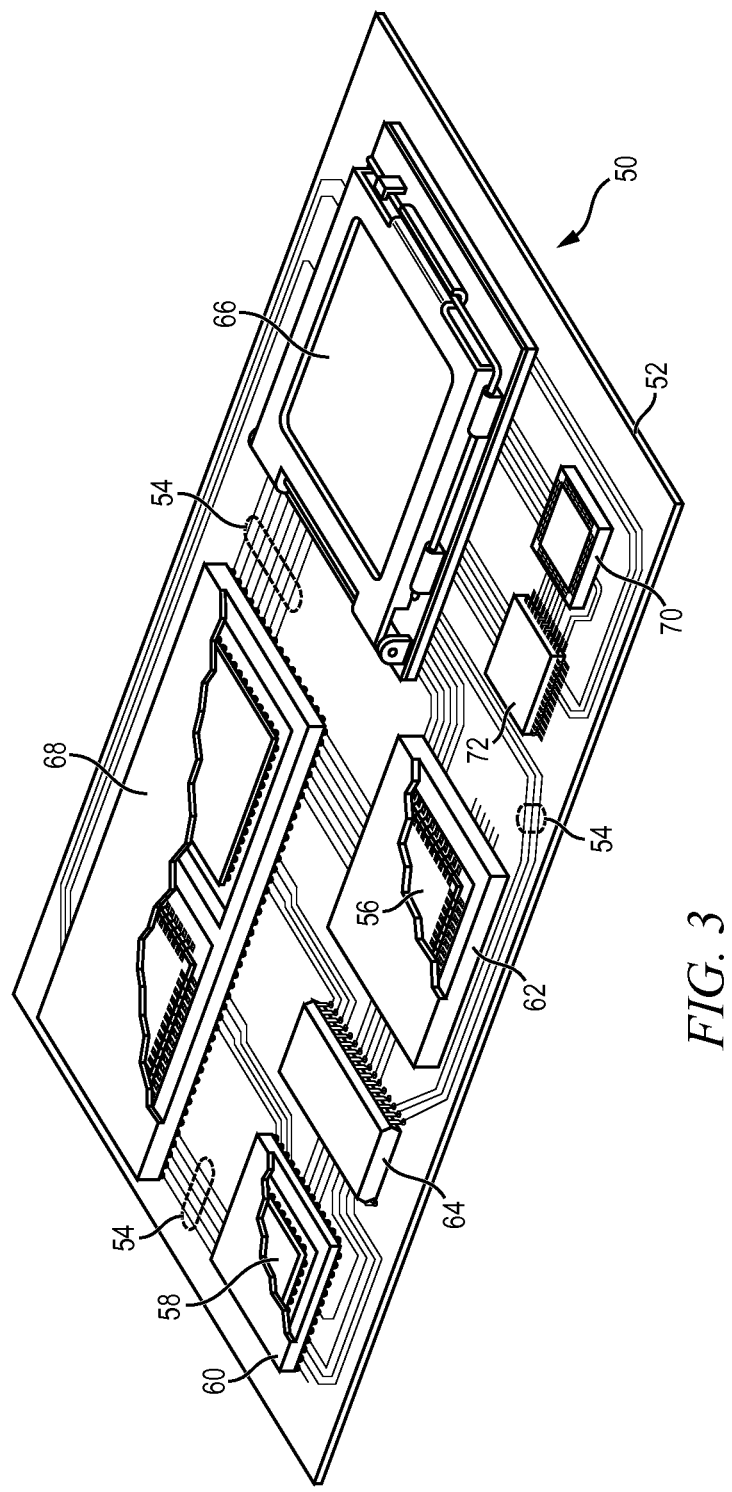
FIG. 3 illustrates a printed circuit board (PCB) with different types of packages mounted to its surface.

FIG. 3 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
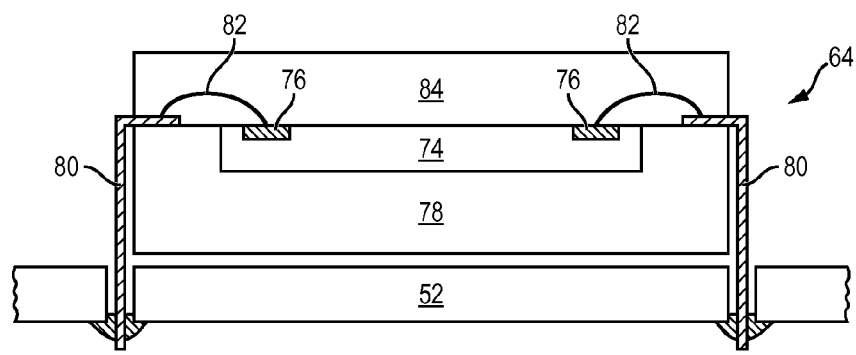
FIGS. 4a-4c illustrate further detail of the representative semiconductor packages mounted to the PCB.
Figure 4B:
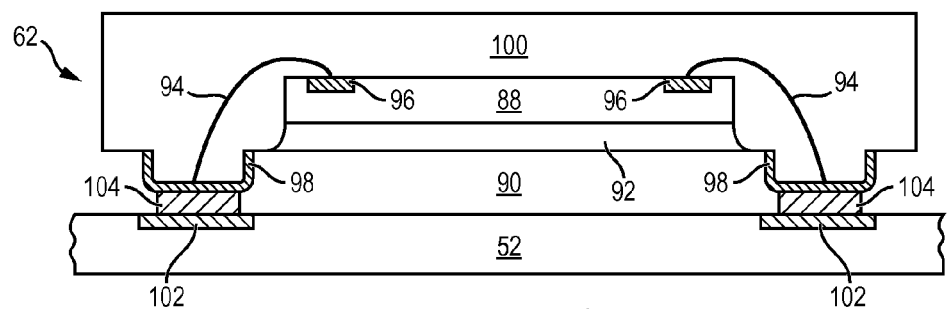
Figure 4C:
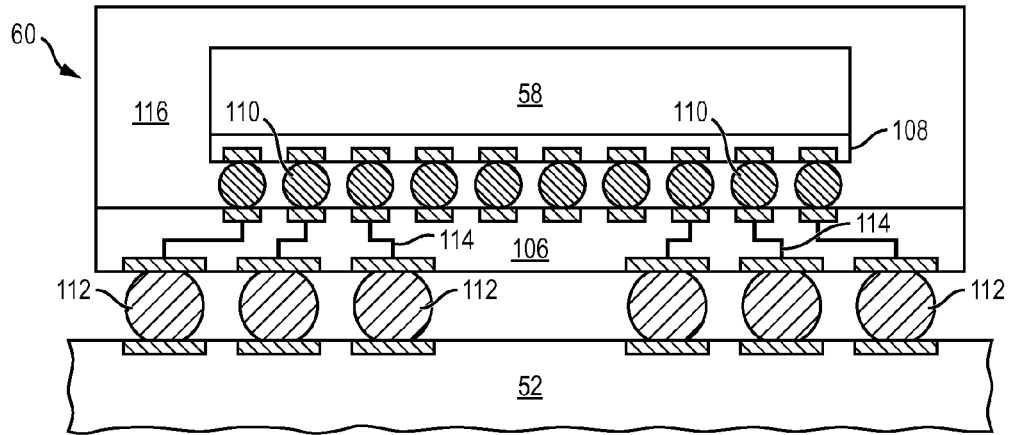

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, Sn, Ni, gold (Au), or Ag, and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5A:
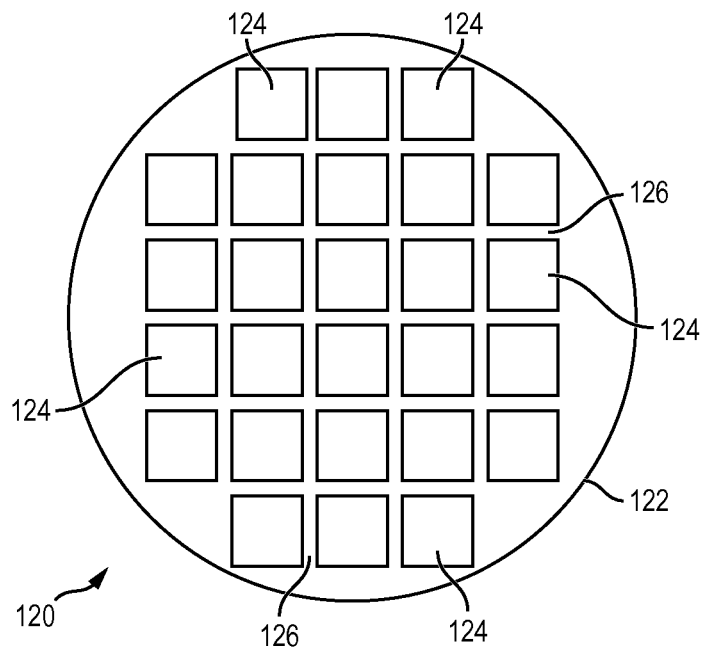
FIGS. 5a-5l illustrate a dual UBM structure.

FIGS. 5a-5l illustrate, in relation to FIGS. 3 and 4a-4c, a process of forming a semiconductor device including a dual UBM structure for lead free bump connections. FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 5B:
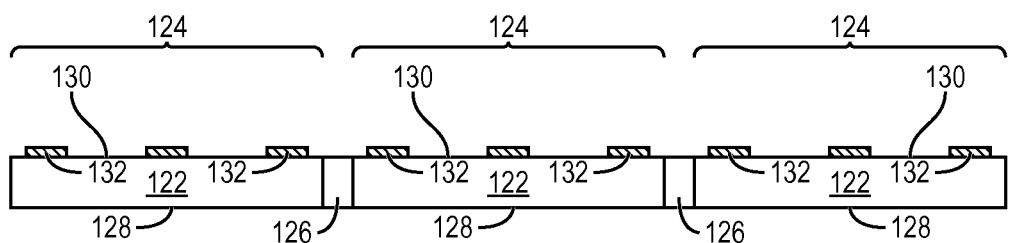

FIG. 5b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 130 to implement analog circuits or digital circuits, such as digital signal processor (DSP), ASIC, memory, or other signal processing circuit. Semiconductor die 124 can also contain IPDs, such as inductors, capacitors, and resistors, for RF signal processing. Semiconductor die 124 can also be a flipchip type semiconductor die.

An electrically conductive layer 132 is formed over and extends above active surface 130 such that a top surface of conductive layer 132 creates an uneven surface, and has a non-planar topology, with respect to active surface 130. Conductive layer 132 is formed using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 5C:
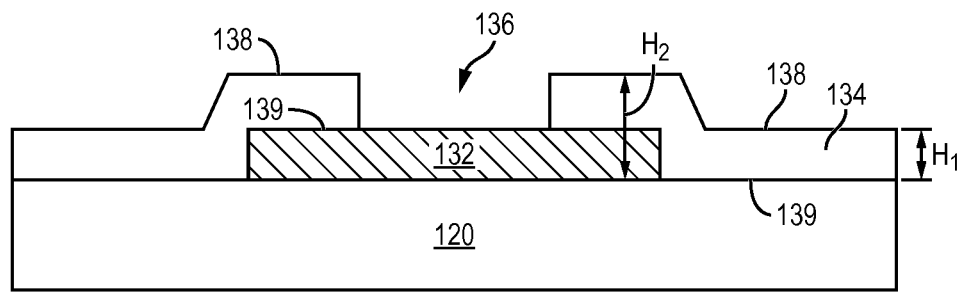

FIG. 5c shows an enlarged cross-sectional view of a portion of semiconductor wafer 120, focusing on conductive layer 132 and an area immediately surrounding the contact pad. Wafer 120 is inspected for IQC. An insulation or passivation layer 134 is then conformally applied to, and follows the contours of, wafer 120 and conductive layer 132 by extending across active surface 130, up the sidewalls of conductive layer 132, and across a top surface of the contact pad. Insulation layer 134 has a top surface 138 that varies in height over wafer 120. A first portion of top surface 138 formed over wafer 120 and outside a footprint of conductive layer 132 has a height of H1. A second portion of top surface 138 formed over wafer 120 and over conductive layer 132 has a height of H2, wherein H2 is greater than H1. The insulation layer 134 can be one or more layers of silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having suitable electrical insulating properties. The insulation layer 134 is patterned or blanket deposited using PVD, CVD, printing, spin coating, sintering with curing, or thermal oxidation. A portion of insulation layer 134 is removed by an etching process to create opening 136 in insulation layer 134 which exposes a portion of conductive layer 132. Opening 136 extends from top surface 138 of insulation layer 134 to a bottom surface 139 of insulation layer 134. Another portion of conductive layer 132 remains covered by insulation layer 134. The partially completed dual UBM structure then undergoes a first scrubber clean.

Figure 5D:
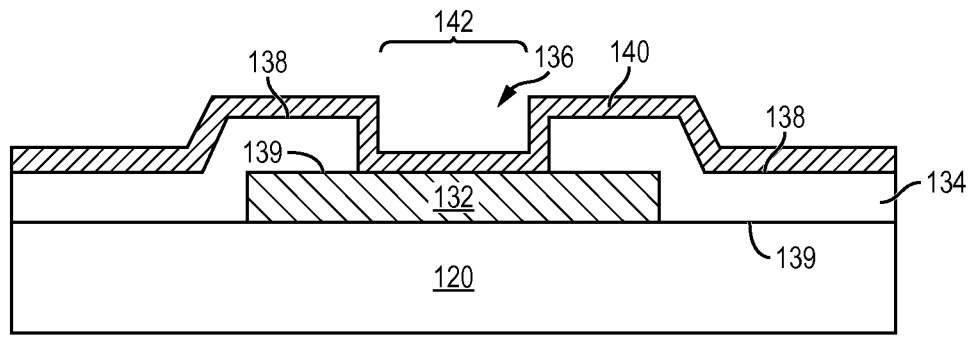

In FIG. 5d, an electrically conductive layer 140 is formed over and conformally applied to insulation layer 134 and conductive layer 132 by using a patterning and metal deposition process such as printing, PVD, CVD, sputtering, electrolytic plating, and electroless plating. In one embodiment, conductive layer 140 is Ti, titanium tungsten (TiW), or chromium (Cr) formed by sputtering. Alternatively, conductive layer 140 can be one or more layers of Al, Cu, Sn, Ni, Au, Ag, or other suitable electrically conductive material. Conductive layer 140 follows the contours of insulation layer 134 across top surface 138, along a side wall of insulation layer 134 within opening 136, and across the top surface of conductive layer 132 within opening 136. Conductive layer 140 includes an area 142 that is within opening 136 and over conductive layer 132. Area 142 is substantially flat, and is smaller than an area of conductive layer 132. Conductive layer 140 operates as a first UBM layer for a later formed bump. The partially completed dual UBM structure then undergoes a second scrubber clean.

Figure 5E:
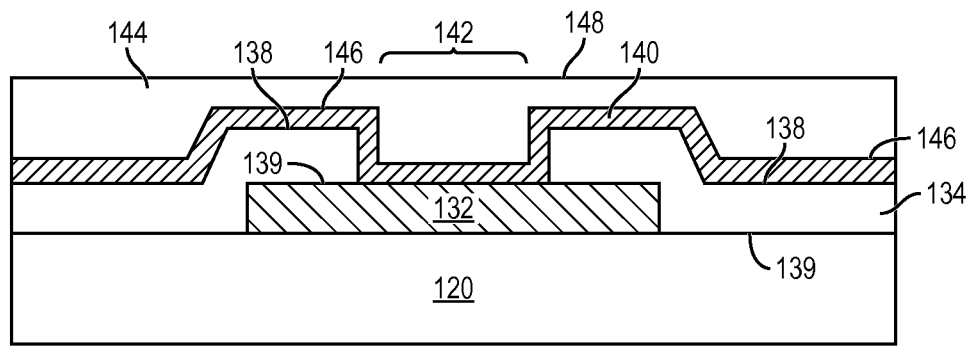

In FIG. 5e, an insulation or passivation layer 144 is deposited or coated over and conformally applied to conductive layer 140 using PVD, CVD, screen printing, spin coating, spray coating, sintering or thermal oxidation. In one embodiment insulation layer 144 includes polyimide, PBO, or BCB. Alternatively, insulation layer 144 contains one or more layers of SiO2, Si3N4, SiON, Ta2O5, Al2O3, or other material having similar insulating and structural properties. A bottom surface 146 of insulation layer 144 follows the contours of conductive layer 140. Top surface 148 of insulation layer 144 is planar and substantially parallel to active surface 130. Accordingly, a thickness of insulation layer 144 measured between bottom surface 146 and top surface 148 varies across wafer 120. Insulation layer 144 serves as a base for a later formed second UBM layer.

Figure 5F:
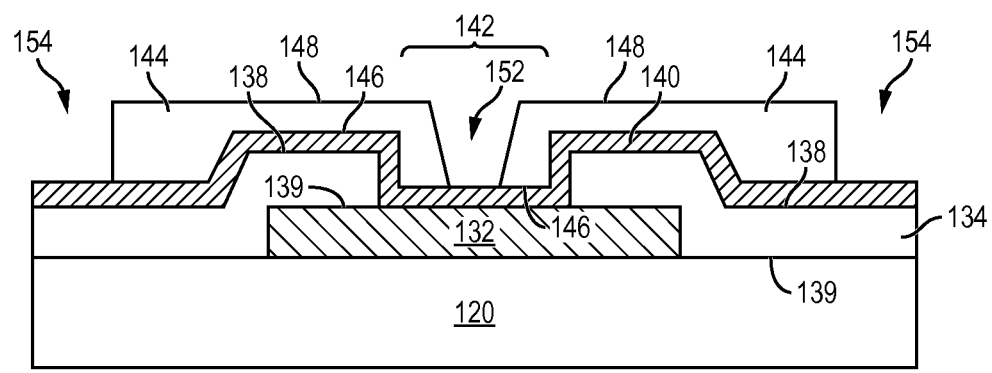

FIG. 5f shows insulation layer 144 is aligned and developed, and that portions of the insulation layer are removed to create openings 152 and 154 in the insulation layer. Opening 152 is formed over area 142 of conductive layer 140. Opening 152 extends from a top surface 148 of insulation layer 144, through the insulation layer to bottom surface 146 of the insulation layer. A footprint of opening 152 has an area that is less than area 142 of conductive layer 140. Opening 152 is formed by a process of patterning and etching insulation layer 144 and exposes a portion of conductive layer 140. Another portion of conductive layer 140 remains covered by insulation layer 144. Opening 152 provides a location for the formation of a later formed second UBM layer. Sidewalls of opening 152 are substantially vertical or angled.

Opening 154 is formed in a perimeter of insulation layer 144 outside a footprint of conductive layer 132 and over a portion of insulation layer 134 with a height of H1. Opening 154 extends from top surface 148 of insulation layer 144, through the insulation layer to a bottom surface 146 of the insulation layer. The remaining portion of insulation layer 144 within a perimeter of opening 154 includes an area sufficient for accommodating a later formed bump. In one embodiment, the remaining portion of insulation layer 144 has an area greater than the area of conductive layer 132.

After insulation layer 144 is patterned and etched to create openings 152 and 154, the insulation layer is cured with a high temperature excursion. Because insulation layer 144 is cured before the formation of a second UBM layer, the risk of IMC formation between the Ti of conductive layer 140 and Cu of a later formed second UBM layer during the high temperature excursion is reduced. After curing insulation layer 144 undergoes a de-scum treatment.

Figure 5G:
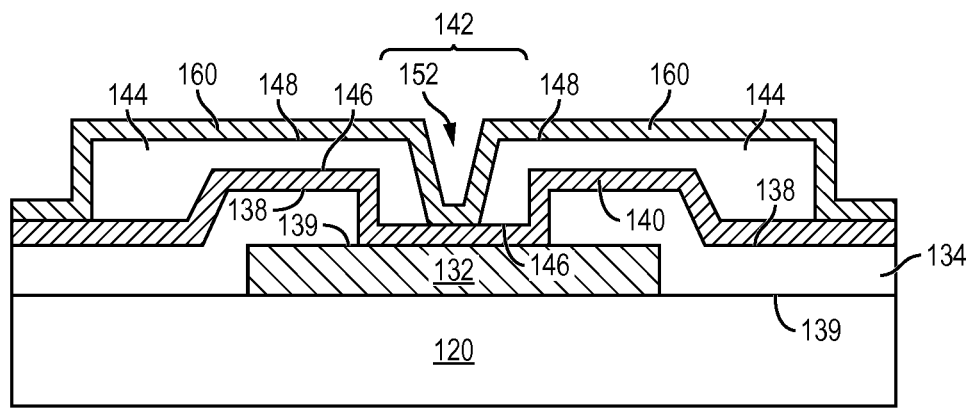

In FIG. 5g, an electrically conductive layer 160 is formed over and conformally applied to insulation layer 144 and conductive layer 140 by using a patterning and metal deposition process such as printing, PVD, CVD, sputtering, electrolytic plating, and electroless plating. In one embodiment, conductive layer 160 includes Ti and Cu, TiW and Cu, or Cr and Cu, and is formed using sputtering or other suitable metal deposition process. Alternatively, conductive layer 160 can be one or more layers of Al, Cu, Sn, Ni, Au, Ag, or other suitable electrically conductive material. Conductive layer 160 follows the contours of conductive layer 140 across a top surface of the conductive layer, along a sidewall of insulation layer 144, across the top surface 148 of insulation layer 144, along a side wall of insulation layer 144 within opening 152 in insulation layer 144, and across the portion of area 142 exposed by opening 152. Conductive layer 160 operates as a second UBM or bump pad for a later formed bump. Because conductive layer 160 follows the contours of opening 152 and is formed over a top surface 148 of insulation layer 144, the insulation layer is formed between, and separates a portion of, conductive layer 160 and conductive layer 140. The separation between conductive layers 140 and 160 by insulation layer 144 reduces a risk of the formation of a Sn—Cu IMC. In conventional POU structures, such as POU 10 shown in FIG. 1, Sn from bump 24 will travel along a sidewall of Ni UMB 20 to react with UBM Cu 18, thereby creating a Sn—Cu IMC. The dual UBM structure including conductive layer 140, insulation layer 144, and conductive layer 160, reduces the risk of Sn from a later formed bump reacting with UBM Cu. After the formation of conductive layer 160, the partially completed dual UBM structure undergoes a scrubber clean process.

Figure 5H:
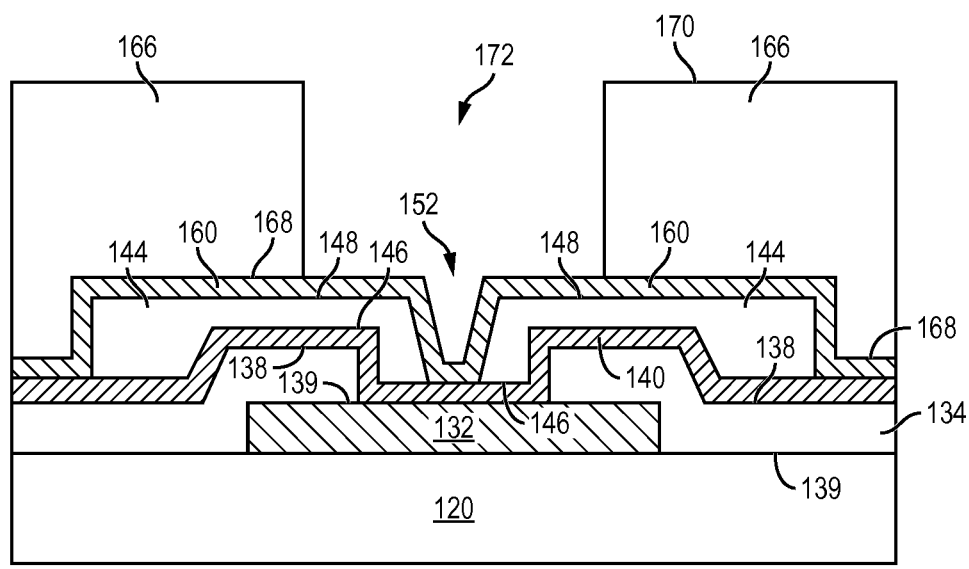

In FIG. 5h, photoresist 166 is deposited over conductive layer 160. A bottom surface 168 of photoresist 166 both covers and follows the contours of conductive layer 160. A top surface 170 of photoresist 166 is substantially flat. Photoresist 166 includes a DFR material with a PET support film. The DFR is laminated, undergoes an edge rinse, is aligned over conductive layer 160, the PET support film is removed, and the DFR material is then developed. The DFR can be irradiated using a visible light laser to form a desired pattern. The irradiated DFR material is then subjected to a developer which selectively dissolves non-irradiated portions of the photoresist material and leaves the irradiated portions of the photoresist material intact.

Accordingly, FIG. 5h further shows photoresist 166 is patterned and etched to form opening 172. Opening 172 extends from the top surface 170 of photoresist 166, through the photoresist layer to a bottom surface 168 of the photoresist layer. A footprint of opening 172 has an area that is greater than an area of opening 152 and smaller than the remaining portion of insulation layer 144. In one embodiment, opening 172 includes a footprint smaller than a footprint of conductive layer 132. Opening 172 exposes a portion of conductive layer 160. Another portion of conductive layer 160 remains covered by photoresist 166. Opening 172 provides a location for the subsequent deposition of a bump material. After the formation of opening 172, the DFR undergoes a first de-scum, a hard bake, and a second de-scum.

Figure 5I:
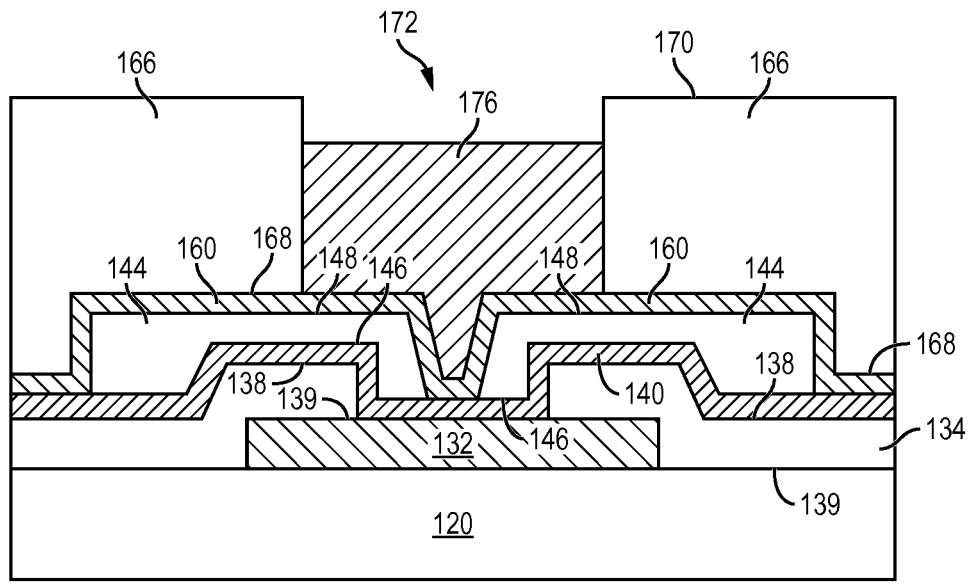

In FIG. 5i, an electrically conductive bump material 176 is deposited within opening 172 and over conductive layer 160 using an evaporation, electrolytic plating, electroless plating, or screen printing process. When the screen printing process is used, bump material 176 is a paste when deposited, and requires a re-flow cycle to solidify the bump material before photoresist layer 166 is removed. Re-flowing bump material 176 solidifies the paste and prevents the bump material from being removed or washed away with the subsequent removal of photoresist layer 166. When bump material 176 is deposited using an evaporation, electrolytic plating, or electroless plating process, the bump material forms a solid bump and does not require the additional re-flow cycle.

In one embodiment, bump material 176 is lead free solder. Alternatively, bump material 176 can be any metal or other electrically conductive material, e.g., Sn, Ni, Au, Ag, Pb, Bi, and alloys thereof, with an optional flux material. For example, the solder material can be eutectic Sn/Pb, high-lead, or lead-free.

Figure 5J:
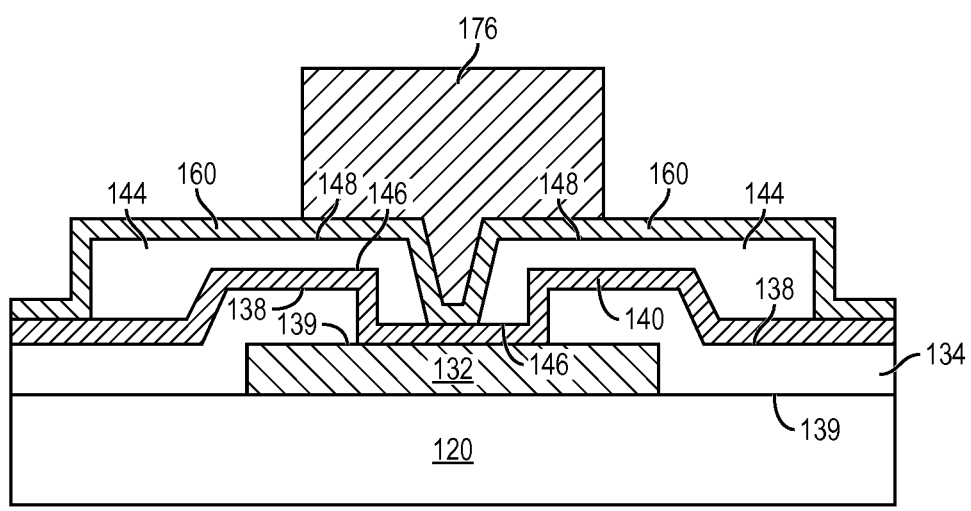

In FIG. 5j, photoresist layer 166 is removed. In one embodiment, the DFR layer is removed to expose sidewalls of bump material 176 by using plasma or reactive chlorine gas. Photoresist layer 166 is stripped away leaving behind bump material 176 over conductive layer 160.

Figure 5K:
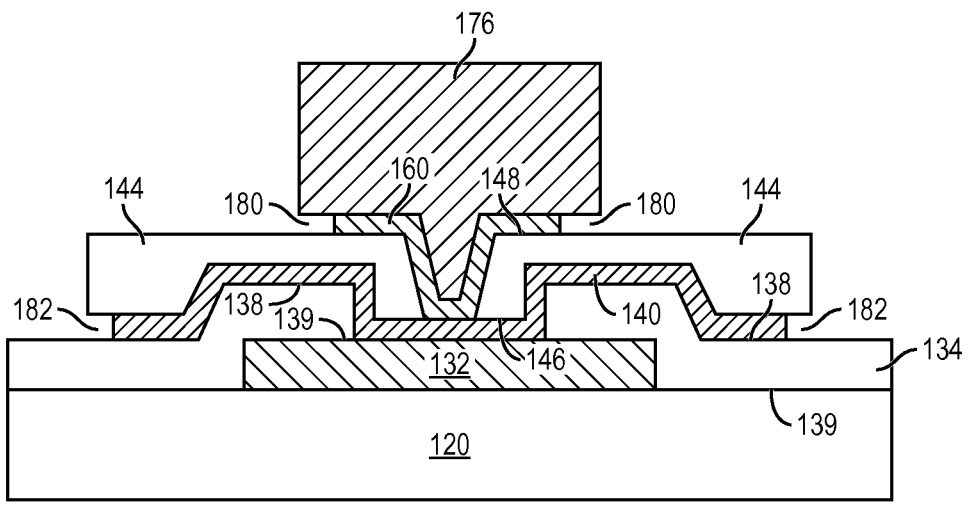

In FIG. 5k, conductive layer 160 is etched to remove a portion of the conductive layer exposed by bump material 176. The etching of conductive layer 160 also removes a portion of the conductive layer in a peripheral region under bump material 176. The removal of the peripheral portion of conductive layer 160 forms a recess 180 that extends partially but not completely under bump material 176. Thus, after the formation of recess 180, bump material 176 extends beyond an end portion of conductive layer 160 and overhangs the conductive layer. Conductive layer 160 has an area smaller than an area of conductive layer 132, or alternatively, can have an area larger than an area of conductive layer 132. Similarly, conductive layer 140 is etched to remove a portion of the conductive layer exposed by insulation layer 144. The etching of conductive layer 140 also removes a portion of the conductive layer in a peripheral region under insulation layer 144. The removal of the peripheral portion of conductive layer 140 forms a recess 182 that extends partially but not completely under insulation layer 144. Thus, after the formation of recess 182 insulation layer 144 extends beyond an end portion of conductive layer 140 and overhangs the conductive layer. Etched conductive layer 140 can have an area equal to or larger than an area of conductive layer 132. After the etching, the partially completed dual UBM structure undergoes a scrubber clean process.

Figure 5L:
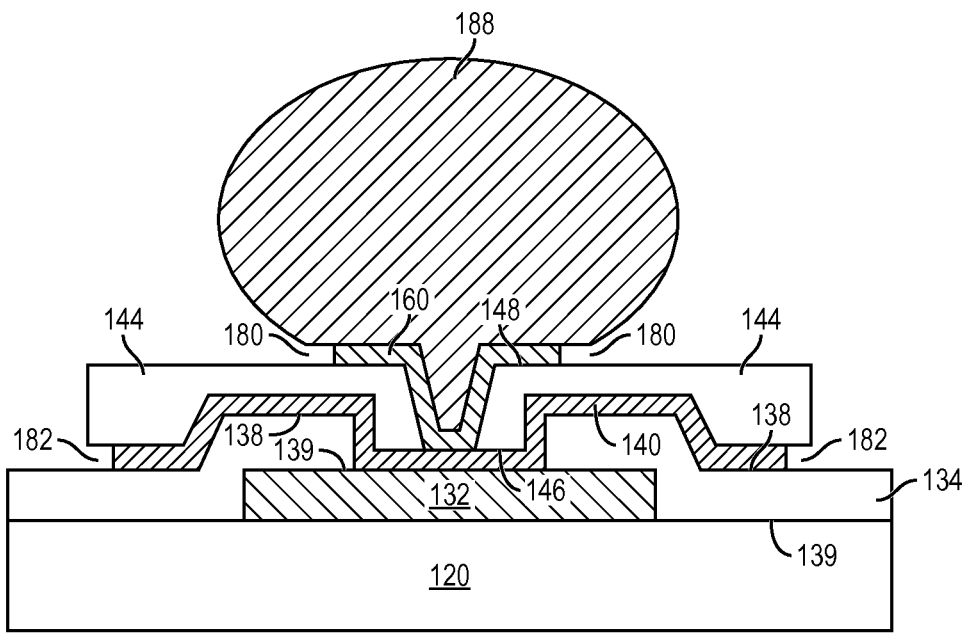

In FIG. 5l, bump material 176 is reflowed by heating the bump material above its melting point to form spherical ball or bump 188. Bump material 176 can also be reflowed with an optional flux material. In some applications, bump 188 is reflowed a second time to improve electrical contact to conductive layer 160. Bump 188 represents one type of interconnect structure that can be formed over conductive layer 160. The interconnect structure can also use 3-D interconnects, conductive paste, stud bump, micro bump, or other electrical interconnect. After bump 188 is formed, the dual UBM structure undergoes an optional flux clean, the bump is measured, and the dual UBM structure undergoes a FVI.

Accordingly, the dual UBM structure provides an improved low-k dielectric design with respect to conventional polyimide and lead free bump structures by reducing crack and delamination during flipchip assembly and reliability tests. Furthermore, because insulation layer 144 is cured before the formation of a second UBM layer, and before the Ti and Cu of first and second UBM layers make contact, the risk of IMC formation between the Ti and Cu during the high temperature excursion is reduced. Additionally, because conductive layer 160 follows the contours of opening 152 and is formed over top surface 148 of insulation layer 144, the insulation layer is formed between, and separates, a portion of conductive layers 140 and 160. The separation between conductive layers 140 and 160 by insulation layer 144 reduces a risk of a Sn—Cu IMC being formed. In conventional POU structures, such as POU 10 shown in FIG. 1, Sn from bump 24 travels along a sidewall of Ni UMB 20 to react with UBM Cu 18, thereby creating a Sn—Cu IMC. Finally, the recited method and device provide a wider process window for high volume manufacturing (HVM) than is otherwise provided by a conventional POU bump structure. The wider HVM window results from an increase in the various stress buffer materials and strippers that can be used to create the dual UBM structure without a chemical damage problem.

Figure 6:
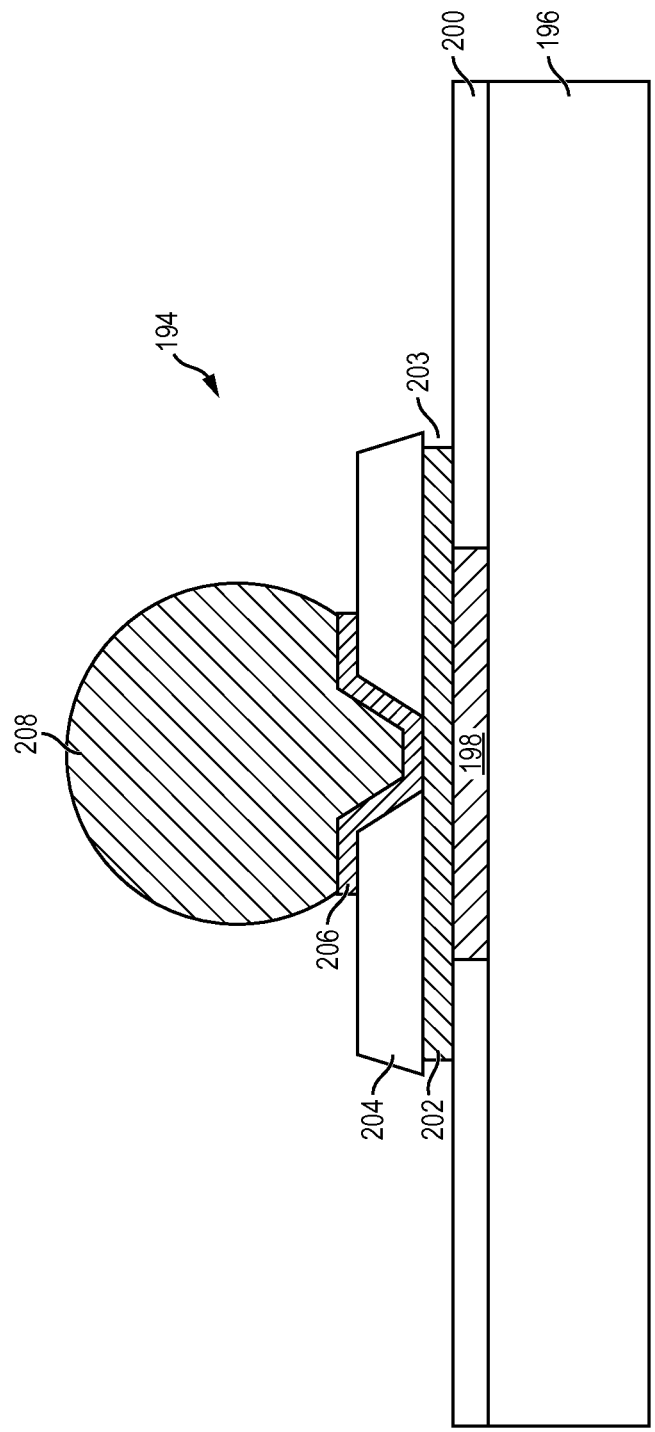
FIG. 6 illustrates an alternate embodiment of the dual UBM structure.

FIG. 6, similar to FIG. 5l, shows an enlarged cross-sectional view of a portion of semiconductor wafer 196, focusing on a dual UBM structure 194. An electrically conductive layer 198 is formed over and extends above an active surface of semiconductor wafer 196 such that a top surface of conductive layer 198 creates an uneven surface, and has a non-planar topology, with respect to semiconductor wafer 196. An insulation or passivation layer 200 is formed over semiconductor wafer 196 and directly contacts a sidewall of conductive layer 198. Insulation layer 200 differs from insulation layer 134 in FIG. 5c by not extending over the adjacent conductive layer 198. In FIG. 5c, insulation layer 134 does extend over adjacent conductive layer 132. FIG. 6 further shows an electrically conductive layer 202 formed over and conformally applied to insulation layer 200 and conductive layer 198 by using a patterning and metal deposition process such as printing, PVD, CVD, sputtering, electrolytic plating, and electroless plating. In one embodiment, conductive layer 202 is Ti formed by sputtering, has top and bottom surfaces with planar topologies, and operates as a first UBM. An insulation or passivation layer 204 is deposited over and conformally applied to conductive layer 202 using PVD, CVD, screen printing, spin coating, spray coating, sintering or thermal oxidation. In one embodiment, insulation layer 204 includes polyimide, PBO, or BCB. Insulation layer 204 is cured with a high temperature excursion before the formation of a second UBM layer. As a result, the risk of IMC formation between the Ti of conductive layer 202 and Cu of a later formed second UBM layer during the high temperature excursion is reduced. In one embodiment, insulation layer 204 has an area greater than an area of conductive layer 198. Conductive layer 202 is etched to form a recess 203 that extends partially but not completely under insulation layer 204. Thus, after the formation of recesses 203 insulation layer 204 extends beyond an end portion of conductive layer 202 and overhangs the conductive layer. An electrically conductive layer 206 is formed over and conformally applied to insulation layer 204 and conductive layer 202 by using a patterning and metal deposition process. In one embodiment, conductive layer 206 is one or more layers of Ti, Cu, Ni, Ti and Cu, TiW and Cu, or Cr and Cu and is formed using sputtering or other suitable metal deposition process. Conductive layer 206 operates as a second UBM or bump pad for a later formed bump. Insulation layer 204 is formed between, and separates a portion of, conductive layers 202 and 206. The separation between conductive layers 202 and 206 by insulation layer 204 reduces a risk of forming a Sn—Cu IMC. Conductive layer 206 has an area smaller than the area of conductive layer 198, or alternatively, can have an area larger than an area of conductive layer 198. Spherical ball or bump 208 is formed over and electrically connects to conductive layer 206. Bump 208 includes any suitable electrically conductive material, and in one embodiment is lead free solder. In one embodiment a footprint of bump 208 has an area that is greater than an area of conductive layer 198 and smaller than insulation layer 204.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a substrate;
a first under bump metallization (UBM) formed over the substrate;
a first insulating layer formed over the first UBM;
a second UBM formed in direct physical contact with the first insulating layer and first UBM; and
a first recess formed in the first UBM with the first insulating layer overhanging the first recess, wherein the first recess is devoid of the first insulating layer.
2. The semiconductor device of claim 1, further including a bump formed over the first UBM and second UBM.

3. The semiconductor device of claim 2, further including a second recess formed between the first insulating layer and bump.

4. The semiconductor device of claim 2, wherein the bump is devoid of direct contact with the first insulating layer.

5. The semiconductor device of claim 1, further including a second insulating layer formed over the substrate.

\* \* \* \* \*